United States Patent
Joshi (10) Patent No.: US 11,004,769 B2
(45) Date of Patent: May 11, 2021

(54) METAL INVERSE OPAL SUBSTRATE WITH INTEGRATED JET COOLING IN ELECTRONIC MODULES

(71) Applicant: Toyota Motor Engineering & Manufacturing North America, Inc., Plano, TX (US)

(72) Inventor: Shailesh N. Joshi, Ann Arbor, MI (US)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 12 days.

(21) Appl. No.: 16/508,842

(22) Filed: Jul. 11, 2019

(65) Prior Publication Data
US 2021/0013126 A1 Jan. 14, 2021

(51) Int. Cl.
*H01L 23/427* (2006.01)
*H01L 23/00* (2006.01)
*H01L 21/48* (2006.01)

(52) U.S. Cl.
CPC ........ *H01L 23/427* (2013.01); *H01L 21/4871* (2013.01); *H01L 24/32* (2013.01); *H01L 24/83* (2013.01); *H01L 2224/32258* (2013.01)

(58) Field of Classification Search
None
See application file for complete search history.

(56) References Cited

U.S. PATENT DOCUMENTS

| 9,970,714 B2 | 5/2018 | Zhou |
| 2018/0320984 A1 | 11/2018 | Lewis et al. |
| 2019/0022650 A1* | 1/2019 | Barcelo ............ B01L 3/502707 |
| 2020/0132394 A1* | 4/2020 | Joshi ..................... H01L 23/427 |

FOREIGN PATENT DOCUMENTS

| JP | 4069447 B2 | 4/2008 |
| WO | 2018226059 A1 | 12/2018 |

OTHER PUBLICATIONS

Metal Inverse Opals could better cool electronics (https://www.electronics-cooling.com/2016/04/metal-inverse-opals-could-better-cool-electronics/); Apr. 7, 2016.

* cited by examiner

*Primary Examiner* — Hsien Ming Lee
(74) *Attorney, Agent, or Firm* — Dinsmore & Shohl LLP (57) ABSTRACT

Embodiments of the disclosure relate to an MIO substrate with integrated jet cooling for electronic modules and a method of forming the same. In one embodiment, a substrate for an electronic module includes a thermal compensation base layer having an MIO structure and a cap layer overgrown on the MIO structure. A plurality of orifices extends through the thermal compensation base layer between an inlet face and an outlet face positioned opposite to the inlet face, defining a plurality of jet paths. A plurality of integrated posts extends outward from the cap layer, wherein each integrated post of the plurality of integrated posts is positioned on the outlet face between each orifice of the plurality of orifices.

20 Claims, 11 Drawing Sheets

METAL INVERSE OPAL SUBSTRATE WITH INTEGRATED JET COOLING IN ELECTRONIC MODULES

TECHNICAL FIELD

The present specification generally relates to a cooling structure for electronic modules and, more specifically, to a substrate for an electronic module comprising a metal inverse opal (MIO) structure with a plurality of orifices and a plurality of integrated posts. A method of forming the substrate is also disclosed.

BACKGROUND

As electronic modules are designed to operate at increased power levels, they generate high heat flux due to the demands of electrical systems. This requires that bonds between the electronic device and the substrate in the electronic module be able to withstand higher temperatures and thermally-induced stresses due to mismatch of coefficient of thermal expansion (CTE) between the electronic device and the substrate. Some bonding layers, such as transient liquid phase (TLP) layers are brittle and can crack due to this CTE mismatch. Conventional heat sinks are unable to adequately remove sufficient heat to effectively lower the operating temperature of the electronic modules to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronic modules challenging.

SUMMARY

The present specification relates to an MIO substrate with integrated jet cooling for electronic modules and a method of forming the same. In one embodiment, a substrate for an electronic module includes a thermal compensation base layer having an MIO structure and a cap layer overgrown on the MIO structure. A plurality of orifices extends through the thermal compensation base layer between an inlet face and an outlet face positioned opposite to the inlet face, defining a plurality of jet paths. A plurality of integrated posts extends outward from the cap layer, wherein each integrated post of the plurality of integrated posts is positioned on the outlet face between each orifice of the plurality of orifices.

In another embodiment, an electronic module includes a substrate and an electronic device. The substrate includes a thermal compensation base layer having an MIO structure and a cap layer overgrown on the MIO structure. A plurality of orifices extends through the thermal compensation base layer between an inlet face and an outlet face positioned opposite to the inlet face, defining a plurality of jet paths. A plurality of integrated posts extends outward from the cap layer, wherein each integrated post of the plurality of integrated posts is positioned on the outlet face between each orifice of the plurality of orifices. The electronic device is electrically coupled to a top surface of each integrated post of the plurality of integrated posts opposite the thermal compensation base layer.

In yet another embodiment, a method of forming a substrate is disclosed. The method includes providing a sacrificial structure comprising a plurality of particles and a plurality of sacrificial posts on a surface of a base substrate. A metal is deposited onto the sacrificial structure until the plurality of particles is covered by the metal. A cap layer is then formed with further deposition of the metal above the plurality of particles. A plurality of integrated posts is formed with further deposition of the metal in selected areas above the cap layer. Finally, at least the plurality of sacrificial posts is removed to form a plurality of orifices extending between the base substrate and the cap layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are directed to a cooling structure for electronic modules and, more specifically, to a substrate for an electronic module comprising a metal inverse opal (MIO) structure with a plurality of orifices for integrated jet cooling and a plurality of integrated posts. A method of forming the substrate is also disclosed.

MIO substrates have integrated metal porous structures that provide a thermal management solution for electronic modules that generate high heat flux. For example, copper inverse opal (CIO) substrates are metal porous structures that provide a unique combination of large surface to volume ratio, high conductivity, and mechanical compliance. The formation of MIO substrates requires a multi-step process including fabrication of a polystyrene (PS) opal structure, electrodeposition of the metal, and etching. Jet impingement cooling is another thermal management solution whereby jets of cooling fluid flow through orifices to impinge on a target surface, such as a heat plate or a surface of an electronic device. The cooling fluid absorbs the heat generated from the target surface and is then routed away to a fluid outlet.

As described herein, the MIO substrate with integrated jet cooling can be utilized as an effective thermal management solution to compensate for the thermally-induced stresses by manageably controlling the thermal expansion and/or stiffness experienced by the substrate and the electronic device. In addition to the unique combination of large surface to volume ratio, high electrical conductivity and mechanical compliance of the MIO substrate, integrated jet cooling capability enables a cooling fluid to be positioned adjacent to the electronic device without intervening insulating components and thus impinge on the bottom surface of the electronic device.

In particular, embodiments herein are directed to an electronic module having an electronic device and a substrate. The substrate generally includes a thermal compensation base layer having a plurality of orifices extending therethrough that define a plurality of jet paths extending along the plurality of orifices. The substrate further includes a plurality of integrated posts extending outward from the thermal compensation base layer, where the plurality of integrated posts is positioned between each orifice of the plurality of orifices. The electronic device is coupled to the plurality of integrated posts along a bottom surface that is oriented transverse to the plurality of jet paths. This allows a cooling fluid to be passed through the plurality of jet paths and impinge on the bottom surface of the electronic device in order to remove thermal energy generated by the electronic device.

In addition to the integrated jet cooling capability, since the substrate is electrically-conductive, it also acts as a collector electrode that is electrically coupled to the electronic device. This allows the cooling fluid to be positioned closer to the electronic device as compared to conventional electronic modules, which may include one or more intervening and insulating components positioned between the electronic device and the cooling fluid. By contrast, in some embodiments of the present application, the cooling fluid directly impinges on the electronic device without first impinging on any intervening layer or component. Various embodiments of the electronic module and methods of forming the same will be described herein with specific reference to the appended drawings.

As used herein, the term "longitudinal direction" refers to the forward-rearward direction of the electronic module (i.e., in the +/−X-direction as depicted). The term "lateral direction" refers to the cross-direction of the electronic module (i.e., in the +/−Y-direction as depicted), and is transverse to the longitudinal direction. The term "vertical direction" refers to the upward-downward direction of the electronic module (in the +/−Z-direction as depicted), and is transverse to the lateral and the longitudinal directions.

Figure 1A:
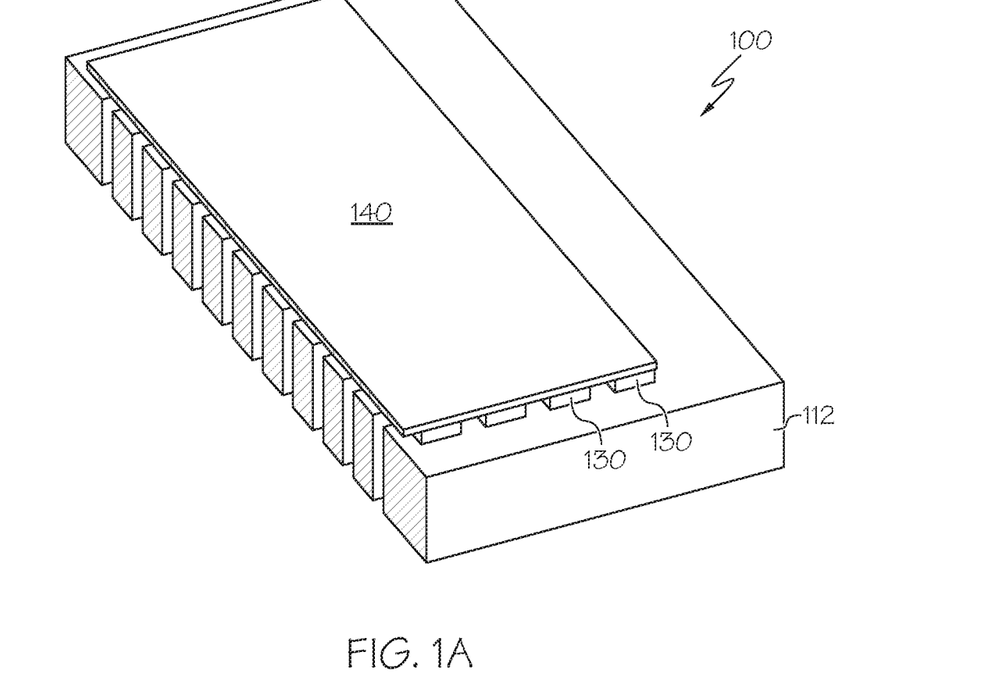
FIG. 1A depicts a cut-away perspective view of an example electronic module, according to one or more embodiments shown and described herein.
Figure 1B:
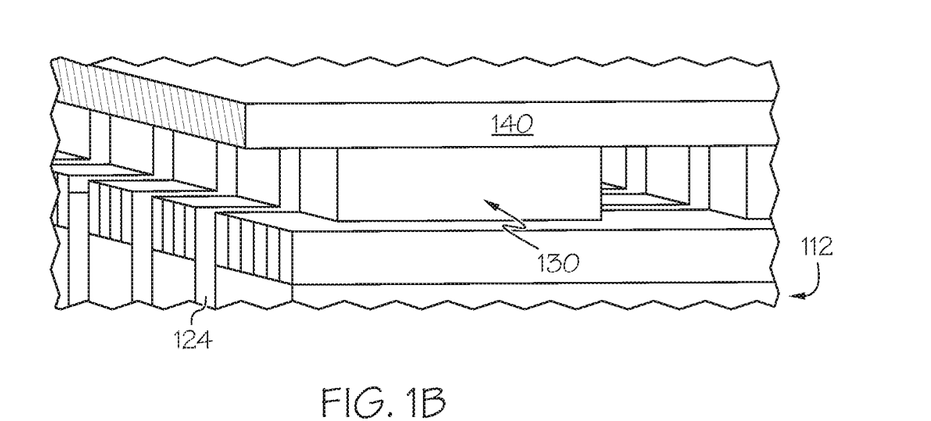
FIG. 1B depicts an enlarged view of a junction between an electronic device and a substrate in an example electronic module, according to one or more embodiments shown and described herein.
Figure 5A:
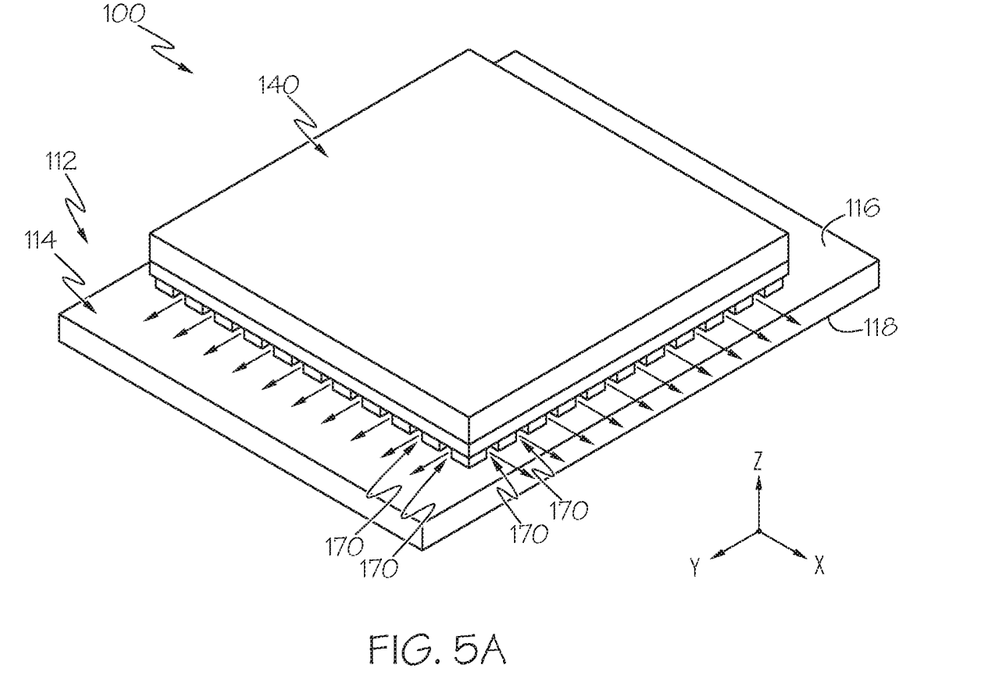
FIG. 5A schematically depicts a perspective view of the electronic module of FIG. 2A after assembly, according to one or more embodiments shown and described herein.

Referring now to the drawings, FIG. 1A depicts a cutaway perspective view of an example electronic module 100, where an electronic device 140 is coupled to a substrate 112 in the electronic module 100 (see FIG. 5A for a perspective view of the assembled electronic module 100). The substrate 112 is an MIO substrate with integrated jet cooling as described in detail herein. In some embodiments, the substrate 112 may be further coupled to another cooling structure such as, but not limited to, a heat sink or a cold plate. The electronic device 140 is electrically coupled to a plurality of integrated posts 130 extending from the substrate 112. FIG. 1B depicts an enlarged view of a junction between the electronic device 140 and the substrate 112 in the electronic module 100. The electronic device 140 extends in a direction transverse to a plurality of jet paths 124 through the substrate 112. The substrate 112 may be encapsulated within a housing 150 having an outlet channel 152 positioned between the housing 150 and the outer perimeter of the substrate 112 (shown in FIG. 2A).

While the electronic device 140 and the substrate 112 depicted in FIG. 1A generally define rectangular shapes, it should be understood that the electronic device 140 and the substrate 112 may have any suitable shape. The electronic device 140 may be one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof power cards). In some embodiments, the electronic device 140 may include a wide-bandgap semiconductor, and may be formed from any suitable material such as, but not limited to, silicon carbide (SiC), aluminum nitride (AlN), gallium nitride (GaN), gallium oxide ($Ga_2O_3$), boron nitride (BN), diamond, and/or the like.

The substrate 112 may be formed from any suitable electrically-conductive metal or metal alloy such as, but not limited to, copper (Cu), oxygen-free Cu, aluminum (Al), Cu alloys, Al alloys, direct-bonded-copper substrates, semiconductor (e.g., silicon) substrates and the like. In some embodiments, the substrate 112 may be plated with a metal on an exterior surface such as, for example, aluminum (Al), nickel (Ni), and the like. As will be described in greater detail herein, the substrate 112 may be formed from a thermally-conductive material for transferring heat from the electronic device 140 to the substrate 112.

The thickness of the electronic device 140 and the substrate 112 may depend on the intended use of the electronic module 100. In non-limiting examples, the electronic device 140 has a thickness between about 0.1 millimeters and about 0.3 millimeters, and the substrate 112 has a thickness between about 1.0 millimeter and about 2.0 millimeters. In this instance, the electronic module 100 may have a maximum height between about 1.1 millimeters and about 2.3 millimeters. It should be understood that other thicknesses of the electronic device 140 and/or the substrate 112 may be utilized in the electronic module 100 without departing from the scope of the present disclosure.

Figure 2A:
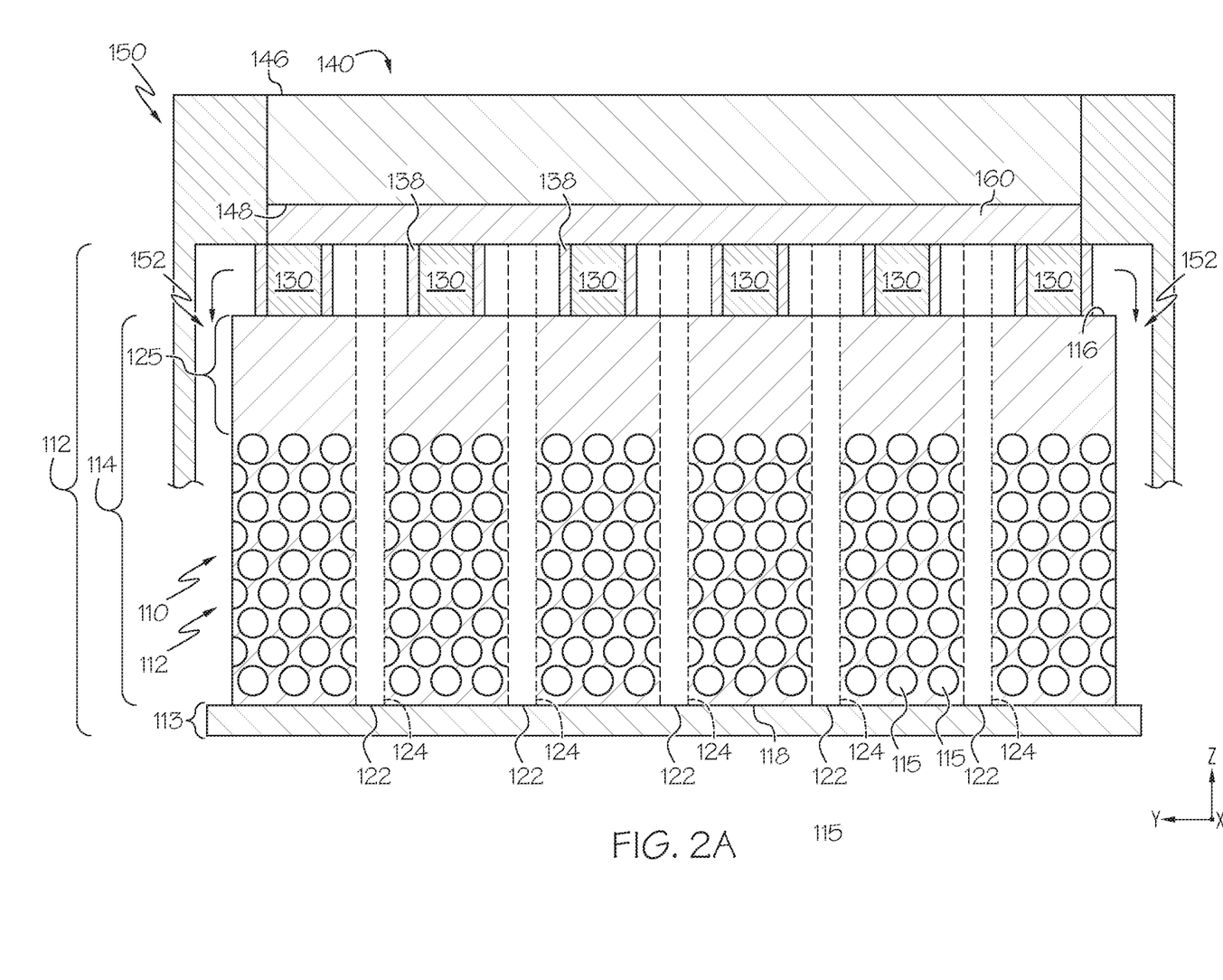
FIG. 2A schematically depicts a cross-sectional view of an example electronic module, according to one or more embodiments shown and described herein.

Referring to FIG. 2A, a cross-sectional view of an example electronic module 100 is depicted. The electronic device 140 is electrically coupled to a collector electrode 110, which in the embodiment depicted in FIG. 2A is the substrate 112 encapsulated within the housing 150. The housing 150 and the substrate 112 define an outlet channel 152 positioned between the housing 150 and the outer perimeter of the substrate 112. The electronic device 140 has a top surface 146 oriented to face upwards in the vertical direction (i.e. along +Z axis) and a bottom surface 148 that is positioned opposite the top surface 146 and oriented to face downwards in the vertical direction (i.e. along -Z axis). The substrate 112 comprises a base substrate 113, a thermal compensation base layer 114 grown on the base substrate 113, a plurality of orifices 122 and a plurality of integrated posts 130. The base substrate 113 can be made of a metal or an electrically-conductive polymer. The thermal compensation base layer 114 has a metal inverse opal (MIO) structure with an inlet face 118 that is oriented to face downward in the vertical direction and an outlet face 116 positioned opposite the inlet face 118 and oriented to face upward in the vertical direction.

The thermal compensation base layer 114 may generally include any inverse opal structure, such as, for example, a copper inverse opal (CIO) structure, a nickel inverse opal (NIO) structure, or other inverse opal structure made from aluminum, silver, zinc, magnesium, or alloys thereof. The MIO structure includes a plurality of voids 115 that define a porosity of the thermal compensation base layer 114. The plurality of voids 115 shown in FIG. 2A is for illustrative purposes only and may be non-uniform in size, shape and arrangement.

Figure 8A:
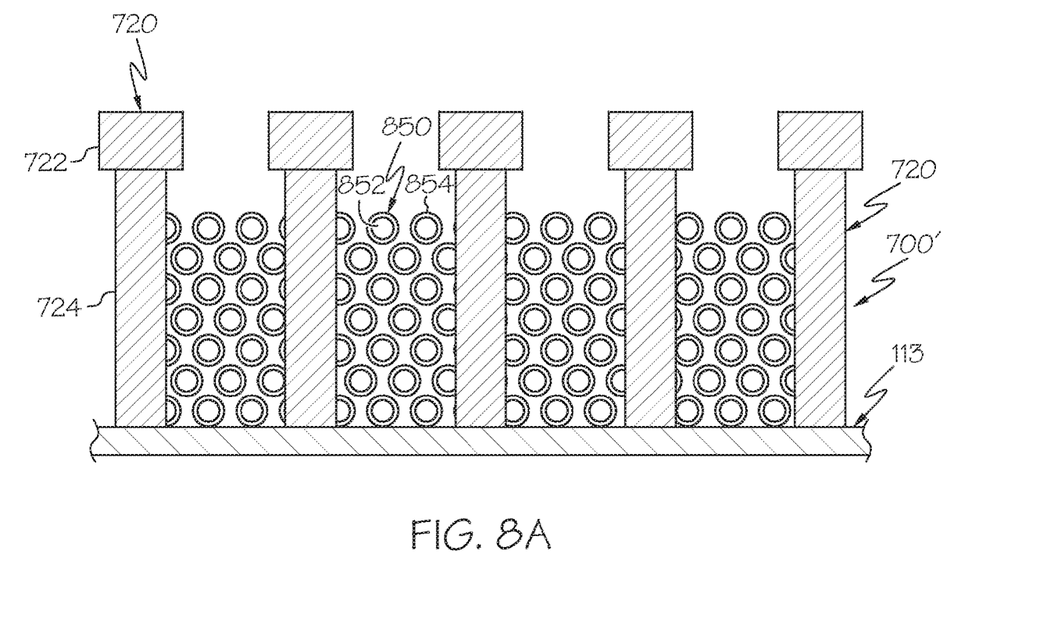
FIGS. 8A-8B depict the first and final products of the method of forming a substrate using a sacrificial structure having a plurality of core-shell phase change (PC) particles, according to one or more embodiments shown and described herein.
Figure 8B:
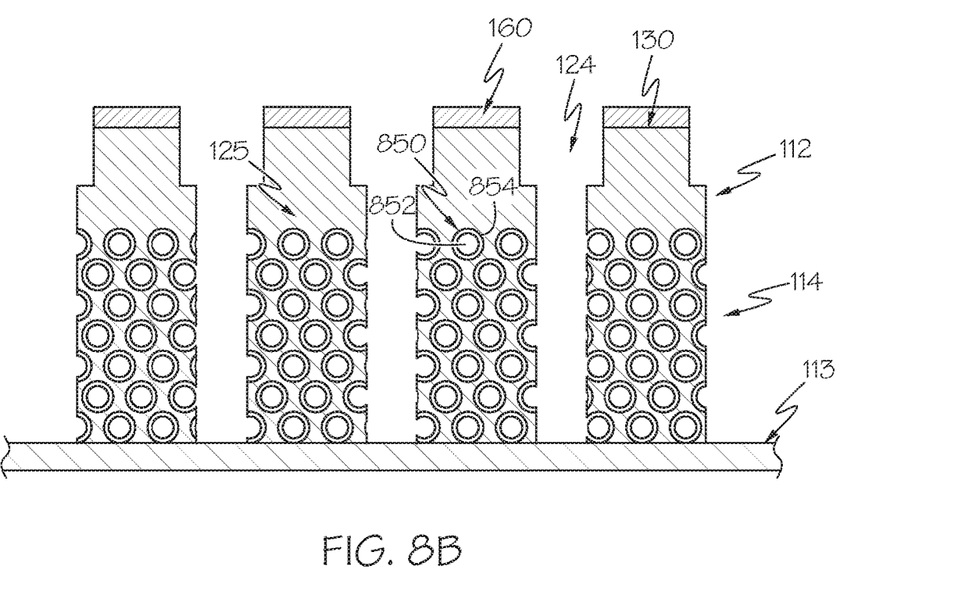

In some embodiments as shown in FIG. 8B, the plurality of voids 115 may be replaced with a plurality of core-shell phase change (PC) particles 850, where each core-shell PC particle 850 has a core 852 and a shell 854. The core 852 has a phase change material (PCM) with a melting point between about 100° C. and about 250° C., while the shell 854 has a shell material having a melting point greater than the melting point of the core and may comprise a metal oxide or an electrically insulating polymer. In some embodiments, the PCM material ay be tin, bismuth or paraffin wax.

The inverse opal structure (MIO structure) in the thermal compensation base layer 114 has a high permeability due to improved control over pore sizes and distribution. Accordingly, the thermal conductivity of the thermal compensation base layer 114 can be varied and controlled to accommodate thermally-induced stresses generated within the electronic module 100. Thus, the thermal compensation base layer 114 can be further configured to provide high heat flux thermal management within the electronic module 100 by improving heat exchange between the electronic device 140 and the substrate 112 at a high rate of heat removal during operation of the electronic device 140.

The thermal compensation base layer 114 may also serve as an electrically-conductive layer between the substrate 112 and the electronic device 140 such that the substrate 112 may be in electrical communication with the electronic device 140 through the porous MIO structure. In some embodiments, a pair of electrodes may be disposed along the electronic device 140 and the substrate 112.

The plurality of orifices 122 extend through the thermal compensation base layer 114 between the inlet face 118 and the outlet face 116. The plurality of orifices 122 collectively defines a plurality of jet paths 124 extending along the plurality of orifices 122. The plurality of jet paths 124 extends in the vertical direction such that the bottom surface 148 of the electronic device 140 is transverse to the bottom surface 148 of the electronic device 140. A cooling fluid flowing through the plurality of orifices 122 impinges on the bottom surface 148 of the electronic device 140 and transfers the heat generated by the electronic device 140 during operation of the electronic module 100. The cooling fluid may be an electrically-conductive fluid, such as an ethylene glycol mixture, water, etc. or a dielectric cooling fluid.

The plurality of integrated posts 130 extend outward from the outlet face 116 of the thermal compensation base layer 114 between each orifice of the plurality of orifices 122. An impingement distance (i.e., a distance evaluated between the plurality of orifices 122 and the bottom surface 148 of the electronic device 140) influences the amount of thermal energy that may be absorbed from the electronic device 140 when the cooling fluid is impinged against the electronic device 140. As shown in FIG. 2A, the impingement distance is dependent upon the height of the plurality of integrated posts 130 evaluated in the vertical direction. As such, the height of the plurality of integrated posts 130 may be selected to achieve a desired impingement distance. In some embodiments, the height of the plurality of integrated posts 130 evaluated in the vertical direction is between about 100 micrometers and about 300 micrometers, inclusive of the endpoints. In one embodiment, the height of the plurality of integrated posts 130 evaluated. in the vertical direction is about 200 micrometers.

The electronic device 140 is electrically coupled to the plurality of integrated posts 130 such that electrical current may be transmitted between the thermal compensation base layer 114 and the electronic device 140. Without being bound by theory, the size and the shape of the plurality of integrated posts 130 influences the transmission of electrical current and thermal energy between the thermal compensation base layer 114 and the electronic device 140. In one embodiment, each of the plurality of integrated posts 130 define a cross-sectional area evaluated in a plane extending in the lateral and the longitudinal directions that is between about 0.25 millimeters squared and about 0.75 millimeters squared. In another embodiment, each of the plurality of integrated posts 130 define a cross-sectional area evaluated in a plane extending in the lateral and the longitudinal directions that is that is about 0.5 millimeters squared. The specific geometry and cross-sectional area of each of the plurality of integrated posts 130 may be selected to achieve desired cooling and/or electrical transmission properties.

In some embodiments, the plurality of integrated posts 130 may be integral with the thermal compensation base layer 114 and formed on the thermal compensation base layer 114 through a subtractive machining process or an additive manufacturing process, as described in greater detail herein. In other embodiments, the plurality of integrated posts 130 may be coupled to the thermal compensation base layer 114 and may be formed from the same or a different material than the thermal compensation base layer 114.

Figure 2B:
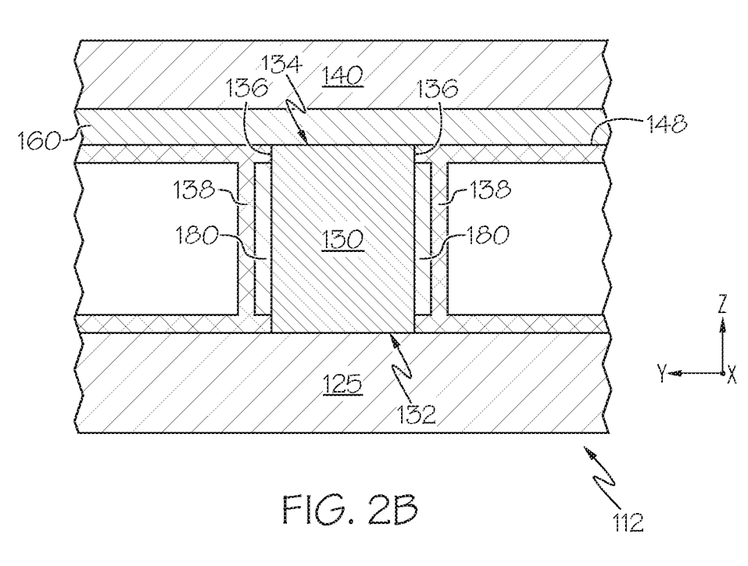
FIG. 2B schematically depicts an enlarged view of an integrated post of the example electronic module of FIG. 2A, according to one or more embodiments shown and described herein.

Referring to FIG. 2B, an enlarged view of the plurality of integrated posts 130 is schematically depicted. Each of the plurality of integrated posts 130 generally include a base end 132 at the thermal compensation base layer 114 and an electronic device end 134 positioned opposite the base end 132 at the electronic device 140. Each integrated post of the plurality of integrated posts 130 further includes at least one outward-facing surface 136 positioned between the base end 132 and the electronic device end 134. The at least one outward-facing surface 136 of each integrated post 130 is generally oriented to face outward in the lateral and/or the longitudinal direction from each of the plurality of integrated posts 130.

In some embodiments, the electronic module 100 further includes an electrically-insulating layer 138 positioned on the at least one outward-facing surface 136 of each of the plurality of integrated posts 130 as well as on the surfaces of the plurality of orifices 122 and the cap layer 125. The electrically-insulating layer 138 is formed from an electrically-insulating material that inhibits the transmission of electrical current through the electrically-insulating layer 138 such as, but not limited to, aluminum oxide, phosphate, parylene, or the like. In some embodiments, the electrically-insulating layer 138 may have a thickness of less than about 1 micrometer and may be deposited through a suitable deposition process, such as atomic layer deposition, chemical vapor deposition, or the like. In some embodiments, the electrically-insulating layer 138 may also be positioned on the bottom surface 148 of the electronic device 140 and/or the thermal compensation base layer 114 of the substrate 112 to electrically insulate the electronic device 140 and/or the substrate 112.

The electrically-insulating layer 138 may generally insulate each integrated post 130 from the cooling fluid such that electrical current may not be passed from the at least one outward-facing surface 136 through the electrically-insulating layer 138, for example to the cooling fluid in contact with and flowing outside each integrated post 130. However, the relatively small thickness of the electrically-insulating layer 138 (e.g., less than about 1 micrometer) may allow thermal energy to be passed from the at least one outward-facing surface 136 through the electrically-insulating layer 138. Thus, when the cooling fluid is incorporated with substrate 112 (shown in FIG. 2B) as compared to conventional configurations, heat flux from the electronic device 140 is effectively transferred to the cooling fluid. In alternative embodiments, the electrically-insulating layer 138 may not be necessary when a dielectric cooling fluid is used.

In some embodiments such as shown in FIG. 2B, the plurality of integrated posts 130 have a porous coating 180 that may assist in transferring thermal energy therefrom to the cooling fluid in contact with each integrated post 130. In some embodiments, the porous coating 180 may be any inverse opal structure such as an MIO structure (e.g., a copper inverse opal (CIO) structure, a nickel inverse opal (NIO) structure, or the like) or any suitable surface texture to assist in transferring thermal energy from the plurality of integrated posts 130 to the cooling fluid. The porous coating 180 may include a variety of surface features such as dimples, networked pores, etc. that increase heat transfer without departing from the scope of the present disclosure. In some embodiments, the electrically-insulating layer 138 is positioned on the porous coating 180 to electrically insulate the porous coating 180, while in other embodiments, the porous coating 180 may be positioned over the electrically-insulating layer 138, such that the electrically-insulating layer 138 is positioned between the porous coating 180 and the plurality of integrated posts 130.

Figure 7A:
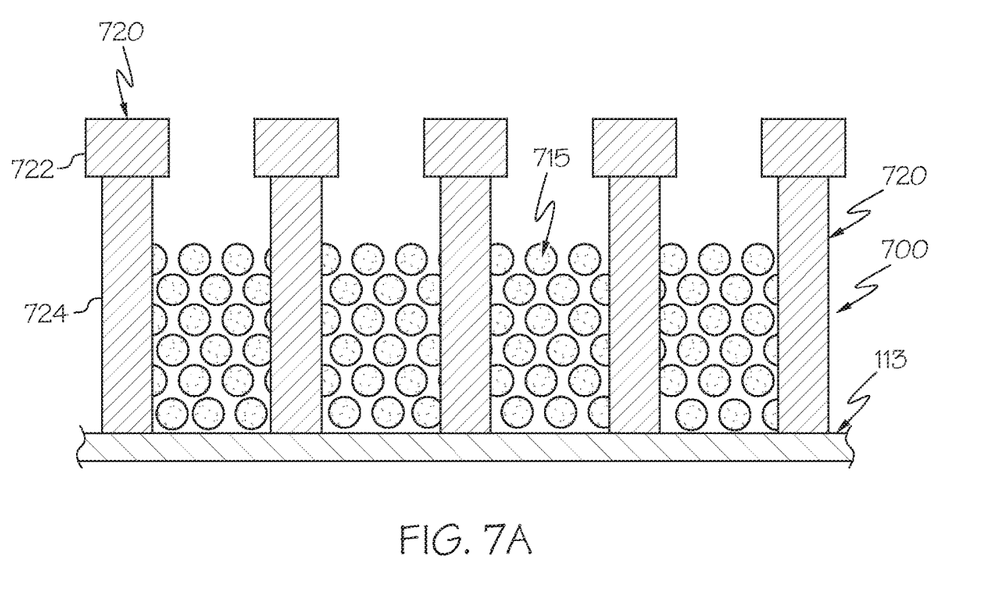
FIGS. 7A-7F depict the various steps of the method of forming a substrate using a sacrificial structure having polystyrene particles, according to one or more embodiments shown and described herein.
Figure 7B:
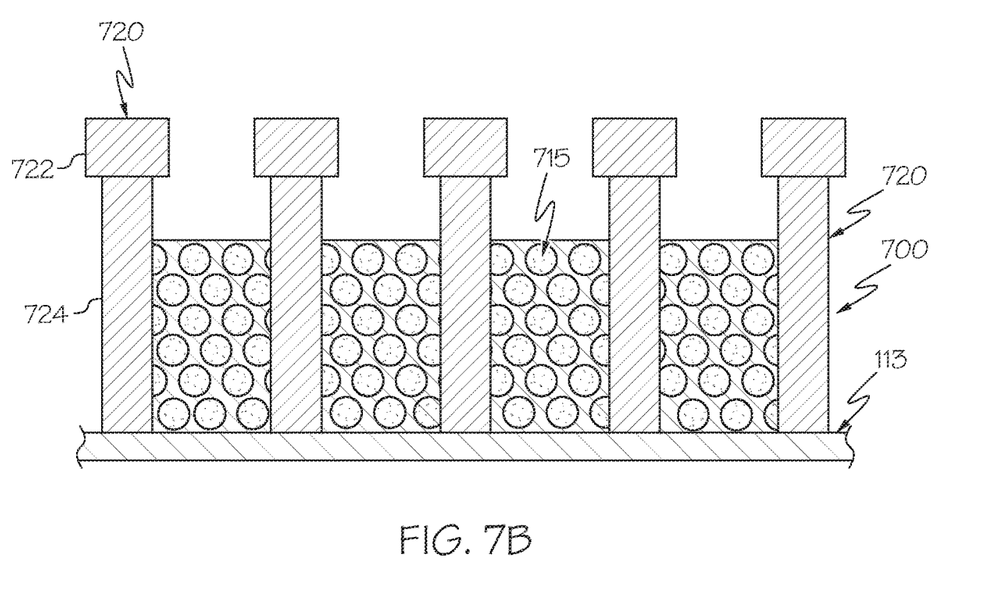
Figure 7C:
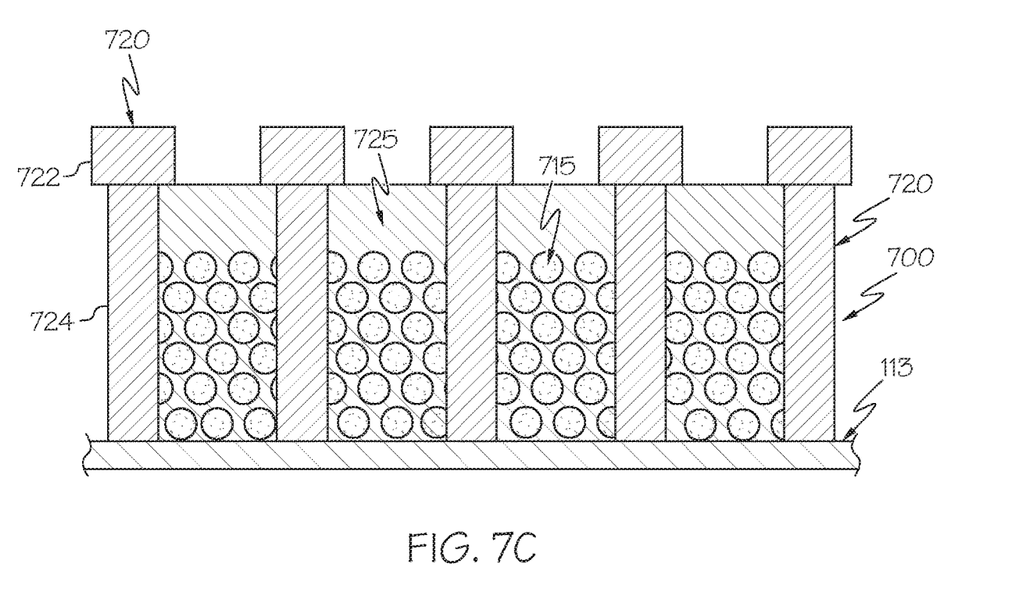
Figure 7D:
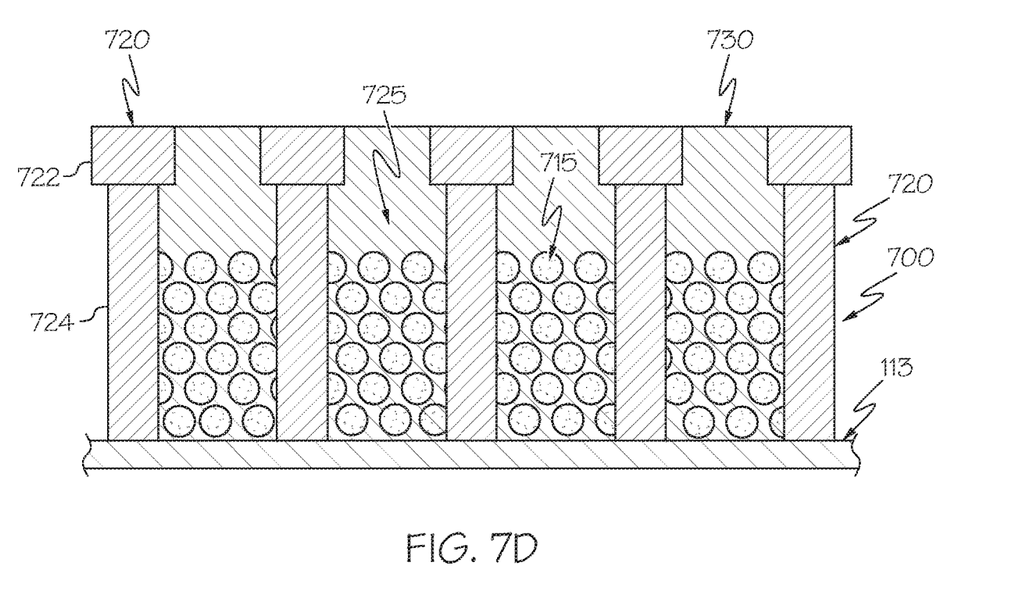
Figure 7E:
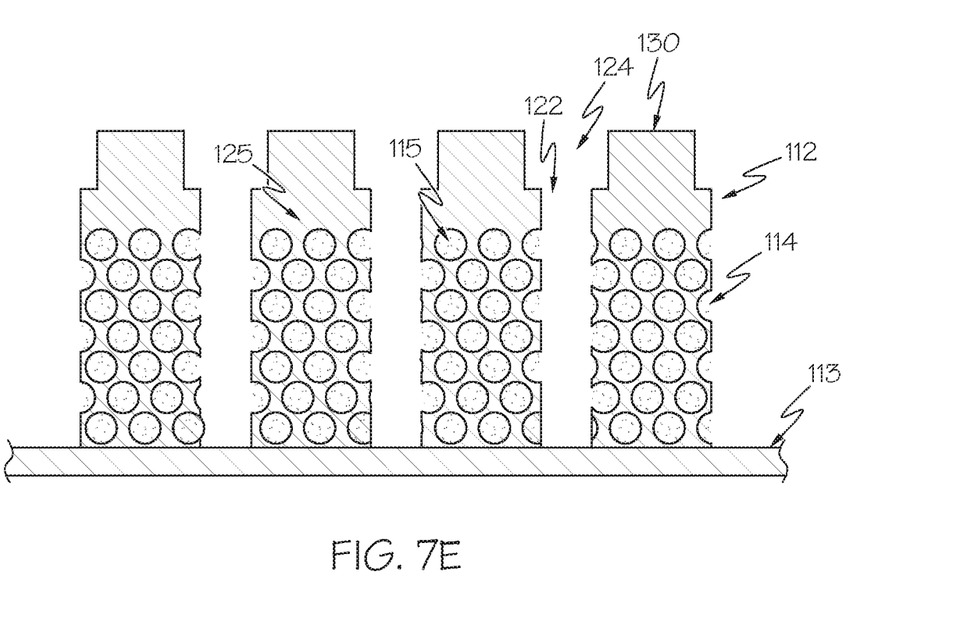
Figure 7F:
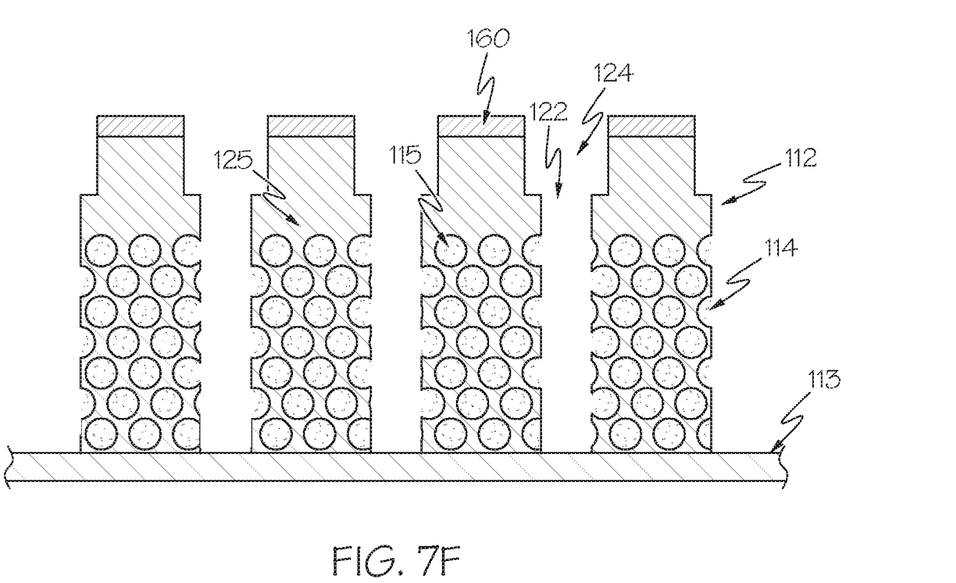

In some embodiments, the electronic module 100 may optionally include an intermediate layer 160 positioned between the plurality of integrated posts 130 and the electronic device 140 such that the plurality of integrated posts 130 are coupled to the electronic device 140 through the intermediate layer 160. The intermediate layer 160 may be a solder layer that extends between adjacent integrated posts 130 in the lateral and/or the longitudinal directions, as shown in FIG. 2A. In other embodiments, the intermediate layer 160 may include solder solely positioned at discrete positions on the plurality of integrated posts 130 (as shown in FIGS. 7F and 8B) such that the electronic device 140 is coupled to the plurality of integrated posts 130. In these embodiments, the solder does not generally extend between adjacent integrated posts 130 in the lateral and/or the longitudinal directions.

Figure 3:
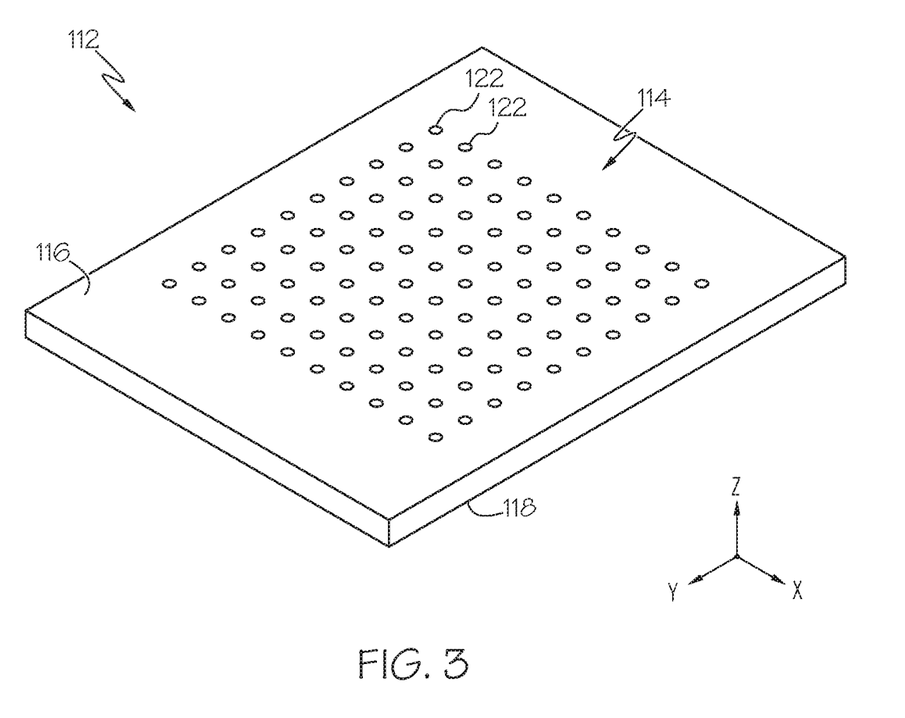
FIG. 3 schematically depicts a perspective view of an outlet face of the substrate of the example electronic module of FIG. 2A defining a plurality of orifices, according to one or more embodiments shown and described herein.

Referring to FIG. 3, a perspective view of an outlet face of the thermal compensation base layer 114 of the substrate 112 is shown. As described above, the thermal compensation base layer 114 has the inlet face 118 and the outlet face 116 positioned opposite the inlet face 118. The thermal compensation base layer 114 includes the plurality of orifices 122 extending therethrough between the inlet face 118 and the outlet face 116. In some embodiments, each of the plurality of orifices 122 are spaced apart from one another in the lateral and the longitudinal directions. While the embodiment depicted in FIG. 3 shows each of the plurality of orifices 122 periodically spaced apart from one another and arranged such that the plurality of orifices 122 forms a rectangular shape on the thermal compensation base layer 114, it should be understood that n other embodiments, the plurality of orifices 122 may be irregularly spaced apart from one another to form any other suitable shape on the thermal compensation base layer 114.

Figure 4A:
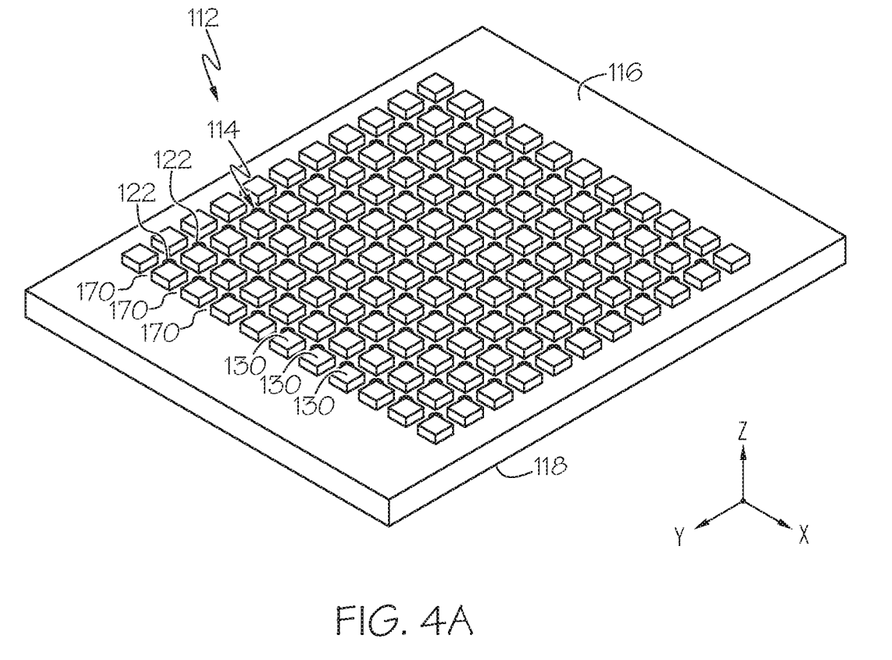
FIG. 4A schematically depicts a perspective view of the substrate of FIG. 3 with a plurality of integrated posts positioned between individual orifices of the plurality of orifices, according to one or more embodiments shown and described herein.

Referring to FIG. 4A, a perspective view of the thermal compensation base layer 114 is shown with the plurality of integrated posts 130 positioned on the outlet face 116 of the thermal compensation base layer 114 and extending outward in the vertical direction. In some embodiments, the plurality of integrated posts 130 may be integrally formed by an additive process, such as by three-dimensional printing, electrodepositing, or the like. in other embodiments, the plurality of integrated posts 130 may be integrally formed through a subtractive machining process, such as by a Lithographie, Galvanoformung, Abformung (LIGA) machining process, or other suitable process. In other embodiments, the plurality of integrated posts 130 may be separately formed and coupled to the thermal compensation base layer 114. For example and without limitation, the plurality of integrated posts 130 may be separately formed from solder material and coupled to the thermal compensation base layer 114.

The plurality of integrated posts 130 define cooling fluid passageways 170 positioned between adjacent integrated posts 130. The length and width of the cooling fluid passageways 170 in the lateral and the longitudinal directions influence the transmission of thermal energy from the plurality of integrated posts 130 and/or the thermal compensation base layer 114 and the electronic device 140 to the cooling fluid flowing through the cooling fluid passageways 170. The size, shape, and positioning of the plurality of integrated posts 130 may be selected to optimize the transfer of thermal energy.

Figure 4B:
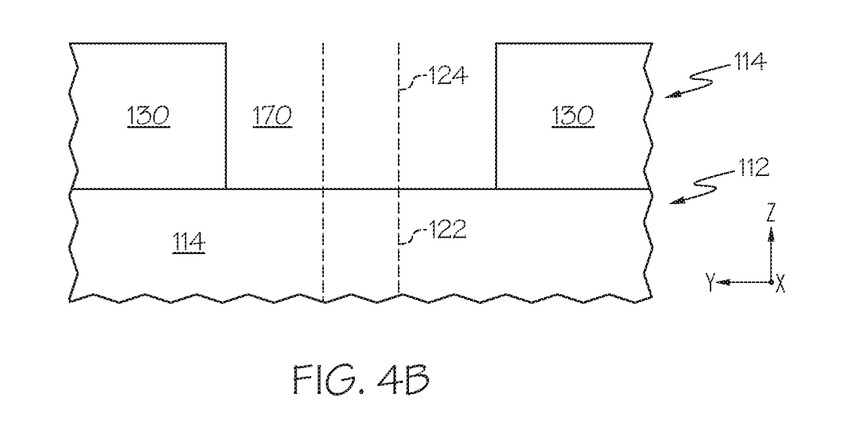
FIG. 4B schematically depicts an enlarged side-view of the substrate of FIG. 4A, according to one or more embodiments shown and described herein.
Figure 5B:
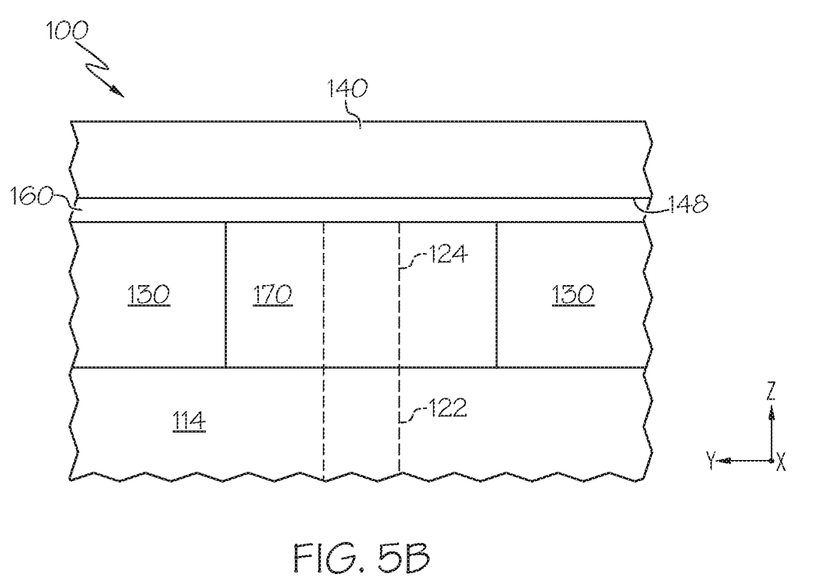
FIG. 5B schematically depicts an enlarged side view of the electronic module of FIG. 5A, according to one or more embodiments shown and described herein.

FIG. 4B schematically depicts an enlarged side-view of the substrate 112 of FIG. 4A and shows adjacent posts of the plurality of integrated posts 130 on the thermal compensation base layer 114. The cooling fluid passageways 170 are positioned between the pair of adjacent posts and allow the cooling fluid to flow outward from the substrate 112 in the lateral and the longitudinal directions. In some embodiments, the cooling fluid passageways 170 are electrically isolated from the plurality of integrated posts 130, as shown in FIG. 2B. The electrically-insulating layer 138 positioned on the at least one outward-facing surface 136 of each integrated post 130 provides electrical insulation from the cooling fluid passageways 170, while permitting thermal energy to be transmitted between the plurality of integrated posts 130 and the cooling fluid passageways 170. FIGS. 5A and 5B schematically depict a perspective view and an enlarged side view of the electronic module 100 of FIG. 1 after assembly.

In operation, the electronic device 140 generates heat that should be dissipated to maintain the electronic device 140 within an acceptable temperature range. To dissipate the heat generated by the electronic device 140, the cooling fluid is passed through the plurality of orifices 122 and impinges on the electronic device 140. In some embodiments as shown in FIG. 5B, the cooling fluid impinges on the intermediate layer 160 positioned between the electronic device 140 and the plurality of integrated posts 130. In other embodiments, such as embodiments that do not include the intermediate layer 160 and/or in which the intermediate layer 160 does not extend between adjacent integrated posts 130, the cooling fluid may directly impinge on the bottom surface 148 of the electronic device 140. Subsequently, the cooling fluid flows outward in the lateral and the longitudinal directions along the cooling fluid passageways 170 towards an outer perimeter of the substrate 112. Then the cooling fluid flows downward through the outlet channel 152. The cooling fluid may subsequently be cooled by an external heat exchanger (not shown), and then passed through the plurality of orifices 122 to impinge on the electronic device 140 again, thereby repeating the process.

Figure 6:
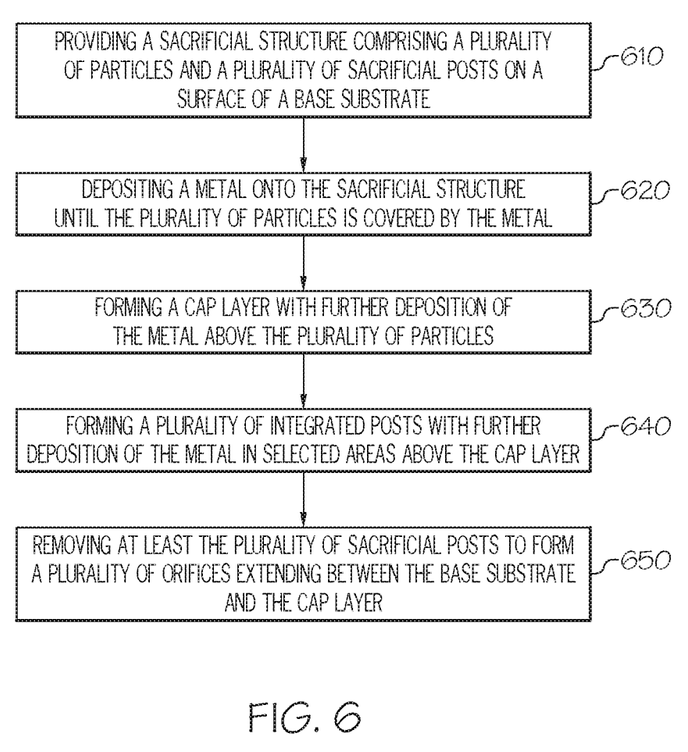
FIG. 6 depicts a block diagram of an example method of forming a substrate, according to one or more embodiments shown and described herein.

FIG. 6 depicts a block diagram of an example method 600 of forming the substrate 112 using a sacrificial structure. The steps 610-650 of the method 600 can be best understood in conjunction with FIGS. 7A-7F which depict the steps when sacrificial polystyrene particles are used in the sacrificial structure. In step 610, a sacrificial structure comprising a plurality of particles and a plurality of sacrificial posts are provided on a surface of a base substrate. As shown in FIG. 7A, the sacrificial structure 700 is provided on the base substrate 113. The sacrificial structure 700 has a plurality of sacrificial polystyrene particles 715 and a plurality of sacrificial polystyrene posts 720. Each of the plurality of sacrificial polystyrene particles 715 may be a hollow sphere with a predefined porosity. In some embodiments, as shown in FIG. 7A, each of the sacrificial polystyrene posts 720 has a T-shape with an upper horizontal portion 722 and a lower vertical portion 724. In other embodiments, each of the sacrificial polystyrene posts 720 may only have a lower vertical portion 724. In yet other embodiments, each of the sacrificial polystyrene posts 720 may be hollow tubes (not shown) having only a lower vertical portion 724 or both an upper horizontal portion 722 and a lo vertical portion 724.

In step 620, a metal is deposited onto the sacrificial structure until the plurality of particles is covered by the metal. As shown in FIG. 7B, a metal such as, but not limited to, copper, nickel, aluminum, silver, zinc, magnesium, or alloys thereof is deposited onto the sacrificial structure 700 until the plurality of sacrificial polystyrene particles 715 is covered by the metal. The metal may be deposited by any suitable process such as, but not limited to, electrodeposition. In step 630, a cap layer is formed with further deposition of the metal above the plurality of sacrificial polystyrene particles 715. As shown in FIG, 7C, the deposition of the metal beyond the sacrificial polystyrene particles 715 forms a cap layer 725.

In step 640, a plurality of integrated posts is formed with further deposition of the metal in selected areas above the cap layer. As shown in FIG. 7D, the plurality of integrated posts 730 are formed beyond the cap layer 725 with further deposition of the metal. In the embodiments where each of the sacrificial polystyrene posts 720 only has a vertical portion, a mask with a plurality of apertures (not shown) placed over the cap layer 725 is used. Each of the plurality of apertures aligns over each of the sacrificial polystyrene posts such that the plurality of integrated posts 730 can be formed in areas between adjacent sacrificial polystyrene posts.

In step 650, at least the plurality of sacrificial posts is removed to form a plurality of orifices extending between the base substrate and the cap layer. In some embodiments, the removal may be done by a process such as, but not limited to, by dissolving the sacrificial structure in an organic solvent or an etching solution. As shown in FIG. 7E, the plurality of sacrificial polystyrene posts 720 of the sacrificial structure 700 is removed to form the plurality of orifices 122 extending between the base substrate 113 and the cap layer 125 and through the thermal compensation base layer 114 described above. The plurality of orifices 122 thus defines the plurality of jet paths 124 through the thermal compensation base layer 114. In some embodiments as shown in FIGS. 7A-7F, the plurality of sacrificial polystyrene particles 715 may be removed with the plurality of sacrificial posts 720 when the sacrificial structure 700 is dissolved in the organic solvent or etching solution, leaving behind the plurality of orifices 122 and a plurality of voids 115 networked together. In other embodiments, only the plurality of sacrificial polystyrene particles 715 are removed first, while the plurality of sacrificial posts 720 are removed by hand or a mechanical tool after the formation of an MIO structure with the plurality of voids 115 and the cap layer 125 overgrown on the MIO structure (not shown). The thermal compensation base layer 114 thus has an MIO structure with the plurality of voids 115, the cap layer 125 overgrown on the MIO structure and the plurality of integrated posts 130 extending outward from the cap layer 125.

In some embodiments, an electrically-insulating layer 138 (as shown in FIG. 2B) is applied on the surfaces of the plurality of orifices 122, the cap layer 125 and the plurality of integrated posts 130, as described above. The electrically-insulating layer 138 may be a layer of aluminum oxide and applied using a process such as, but not limited to atomic layer deposition. The electrically-insulating layer has a thickness less than about 1 micrometer and isolates the cooling fluid from the thermal compensation base layer 114.

FIG, 7F shows deposition of the intermediate layer 160 on the plurality of integrated posts 130. The intermediate layer 160 may be a bonding layer such as, but not limited to, solder layer or a transient liquid phase bonding layer, as described above. The electronic device 140 can be coupled to the plurality of integrated posts 130 using the intermediate layer 160 on each of the posts 130 such that the electronic device 140 extends in a direction transverse to the plurality of orifices 122.

In some embodiments, the plurality of particles in the sacrificial structure may be core-shell phase change (PC) particles that are not dissolved or otherwise removed. Each core-shell PC particle has a core and a shell. The core has a phase change material (PCM) with a melting point between about 100° C. and about 250° C., while the shell has a shell material having a melting point greater than the melting point of the core and may comprise a metal oxide or an electrically insulating polymer. In some examples, the PCM material may be tin, bismuth or paraffin wax. FIGS. 8A-8B depict the first and final products of the method 600 of forming the substrate 112 wherein the plurality of particles comprise core-shell phase change (PC) particles. In FIG. 8A, the sacrificial structure 700' is provided on the base substrate 113. The sacrificial structure 700' has a plurality of core-shell PC particles 850 and a plurality of sacrificial polystyrene posts 720. Each core-shell PC particle 850 has a core 852 and a shell 854. FIG. 8B shows the final product after a metal is deposited on the sacrificial structure 700', a cap layer 125 and a plurality of integrated posts 130 are formed and the plurality of sacrificial polystyrene posts 720 are removed. The core-shell PC particles 850 do not dissolve in the organic solvent or etching solution while the rest of the sacrificial structure 700' dissolves to leave behind thermal compensation base layer 114 with an MIO structure. The presence of the core-shell PC particles 850 in the MIO structure increases the heat capacity of the thermal compensation base layer 114.

The apparatuses and methods described herein can be advantageously used as a thermal management solution for electronic modules having high heat flux applications. The apparatuses and methods enable compact package design of the thermal management solution with the electronic module. The electronic module may be used in a vehicular electrical system, for example as part of an inverter system in an electric or hybrid-electric vehicle. In vehicular applications, this enables the electronic module to he maintained within a suitable operating temperature range.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A substrate for an electronic module, the substrate comprising:
   a thermal compensation base layer comprising a metal inverse opal (MIO) structure and a cap layer overgrown on the MIO structure;
   a plurality of orifices extending through the thermal compensation base layer between an inlet face and an outlet face positioned opposite to the inlet face, the plurality of orifices defining a plurality of jet paths; and
   a plurality of integrated posts extending outward from the cap layer, wherein each integrated post of the plurality of integrated posts is positioned on the outlet face between each orifice of the plurality of orifices.

2. The substrate of claim 1, wherein the metal of the MIO structure comprises copper, nickel, aluminum, silver, zinc, magnesium, or alloys thereof.

3. The substrate of claim 1, wherein the structure further comprises a plurality of voids and a predefined porosity.

4. The substrate of claim 1, wherein:
   the MIO structure comprises a plurality of core-shell phase change (PC) particles encapsulated therein; and
   each core-shell PC particle comprises:
      a core comprising a phase change material (PCM) with a melting point between about 100° C. and about 250° C.; and
      a shell comprising a shell material having a melting point greater than the melting point of the core.

5. The substrate of claim 4, wherein the PCM comprises tin, bismuth or paraffin wax.

6. The substrate of claim 4, wherein the shell material comprises a metal oxide or an electrically-insulating polymer.

7. The substrate of claim 1, further comprising an electrically-insulating layer on the surfaces of the plurality of orifices, the cap layer and the plurality of integrated posts.

8. The substrate of claim 7, wherein the electrically-insulating layer has a thickness less than about 1 micrometer.

9. An electronic module comprising:
   a substrate comprising:
      a thermal compensation base layer comprising an MIO structure and a cap layer overgrown on the MIO structure;
      a plurality of orifices extending through the thermal compensation base layer between an inlet face and an outlet face positioned opposite to the inlet face, the plurality of orifices defining a plurality of jet paths; and
      a plurality of integrated posts extending outward from the cap layer, wherein each integrated post of the plurality of integrated posts is positioned on the outlet face between each orifice of the plurality of orifices; and
   an electronic device electrically coupled to a top surface of each integrated post of the plurality of integrated posts opposite the thermal compensation base layer.

10. The electronic module of claim 9, wherein the electronic device is electrically coupled to the top surface of each integrated post of the plurality of integrated posts by a solder layer or a transient liquid phase bonding layer.

11. A method of forming a substrate, the method comprising:
   providing a sacrificial structure comprising a plurality of particles and a plurality of sacrificial posts on a surface of a base substrate;
   depositing a metal onto the sacrificial structure until the plurality of particles is covered by the metal;
   forming a cap layer with further deposition of the metal above the plurality of particles;
   forming a plurality of integrated posts with further deposition of the metal in selected areas above the cap layer; and
   removing at least the plurality of sacrificial posts to form a plurality of orifices extending between the base substrate and the cap layer.

12. The method of claim 11 further comprising electrically coupling an electronic device to the plurality of integrated posts, the electronic device extending in a direction transverse to the plurality of orifices.

13. The method of claim 11, wherein forming a plurality of integrated posts is performed by using a mask with a plurality of apertures placed over the cap layer.

14. The method of claim 11 wherein the plurality of sacrificial posts comprise polystyrene.

15. The method of claim 11, wherein each sacrificial post of plurality of sacrificial posts has an upper horizontal portion over a lower vertical portion to form a T-shape.

16. The method of claim 11, wherein removing at least the plurality of sacrificial posts further comprises dissolving the sacrificial structure in an organic solvent or an etching solution.

17. The method of claim 11 further comprising removing the plurality of particles by dissolving the sacrificial structure in an organic solvent or an etching solution, wherein the plurality of particles comprises sacrificial polystyrene particles.

18. The method of claim 11, wherein the plurality of particles comprise core-shell phase change (PC) particles, each core-shell PC particle comprising:
   a core comprising a phase change material (PCM) with a melting point between about 100° C. and about 250° C.; and
   a shell comprising a shell material having a melting point greater than the melting point of the core.

19. The method of claim 11 further comprising applying an electrically-insulating layer on the surfaces of the plurality of orifices, the cap layer and the plurality of integrated posts.

20. The method of claim 19, wherein applying the electrically-insulating layer is performed by atomic layer deposition.

* * * * *

UNITED STATES PATENT AND TRADEMARK OFFICE
CERTIFICATE OF CORRECTION

PATENT NO. : 11,004,769 B2  
APPLICATION NO. : 16/508842  
DATED : May 11, 2021  
INVENTOR(S) : Shailesh N. Joshi It is certified that error appears in the above-identified patent and that said Letters Patent is hereby corrected as shown below:

In the Specification

In Column 5, Line(s) 39, delete "material ay" and insert --material may--, therefor.

In the Claims

In Column 12, Line 50, Claim 12, after "claim 11", insert --,--, therefor.

In Column 12, Line 57, Claim 14, after "claim 11", insert --,--, therefor.

In Column 12, Line 66, Claim 17, after "claim 11", insert --,--, therefor.

In Column 13, Line 12, Claim 19, after "claim 11", insert --,--, therefor.

Signed and Sealed this  
Twenty-second Day of June, 2021

Drew Hirshfeld  
*Performing the Functions and Duties of the*  
*Under Secretary of Commerce for Intellectual Property and*  
*Director of the United States Patent and Trademark Office*